(12) United States Patent
Joffe

(10) Patent No.: US 6,359,505 B1
(45) Date of Patent: Mar. 19, 2002

(54) COMPLEMENTARY PAIR-CONFIGURED TELECOMMUNICATION LINE DRIVER HAVING SYNTHESIZED OUTPUT IMPEDANCE

(75) Inventor: Daniel M. Joffe, Owens Crossroads, AL (US)

(73) Assignee: Adtran, Inc., Huntsville, AL (US)

( * ) Notice: Subject to any disclaimer, the term of this patent is extended or adjusted under 35 U.S.C. 154(b) by 0 days.

(21) Appl. No.: 09/781,566

(22) Filed: Dec. 19, 2000

(51) Int. Cl.[7] ............................................... H03F 3/45
(52) U.S. Cl. ........................ 330/69; 330/103; 330/165
(58) Field of Search ........................... 330/69, 103, 104, 330/165, 195

(56) References Cited

U.S. PATENT DOCUMENTS

| | | | | |
|---|---|---|---|---|
| 3,516,006 A | * | 6/1970 | Donjon .......................... 330/69 |
| 3,566,298 A | * | 2/1971 | Stevens ......................... 330/84 |
| 4,661,978 A | | 4/1987 | Hirata .......................... 379/394 |
| 4,887,045 A | * | 12/1989 | Nakayama .................... 330/69 |
| 4,963,845 A | | 10/1990 | Collier ......................... 333/214 |
| 5,485,115 A | | 1/1996 | Nordeng ....................... 327/363 |
| 5,856,758 A | | 1/1999 | Joffe et al. ..................... 330/85 |
| 5,990,737 A | * | 11/1999 | Czarnul et al. ................ 330/69 |
| 6,057,731 A | * | 5/2000 | Gorcea et al. ................. 330/69 |

* cited by examiner

Primary Examiner—Robert Pascal
Assistant Examiner—Henry Choe
(74) Attorney, Agent, or Firm—Allen, Dyer, Doppelt, Milbrath & Gilchrist, P.A.

(57) ABSTRACT

A synthetic impedance line driver for driving a telecommunication line includes a complementary operational amplifier pair having cross-coupled positive feedback summing resistors. The driver circuit is configured to provide a relatively large multiplication of the values of relatively small valued output resistors to realize a synthesized impedance matching that of the driven line. A cross-coupled resistor network may be employed to cancel out far end signal components present in an analog canceler drive signal. The values of the auxiliary network resistors are ratioed such that the signal at nodes between resistors of branches of the network is a fraction of the open circuit voltage swing of the amplifiers, with far end signal components canceled.

18 Claims, 2 Drawing Sheets

COMPLEMENTARY PAIR-CONFIGURED TELECOMMUNICATION LINE DRIVER HAVING SYNTHESIZED OUTPUT IMPEDANCE

FIELD OF THE INVENTION

The present invention relates in general to communication systems and components, and is particularly directed to a complementary driver pair-based circuit architecture having a synthesized output impedance, and substantially reduced power requirements for driving a telecommunication line, such as, but not limited to a high data rate digital subscriber line (HDSL).

BACKGROUND OF THE INVENTION

As described in the U.S. Patent to Joffe et al, U.S. Pat. No. 5,856,758, assigned to the assignee of the present application and the disclosure of which is incorporated herein, the often demanding installation and operational parameters of many of today's telecommunication system applications make it necessary to employ line driver circuits having extremely low distortion and highly linear signal components. One of the basic, unalterable requirements of a line driver is that its output impedance match the characteristic impedance of the line.

As diagrammatically shown in the 'classical' circuit architecture of FIG. 1, this impedance matching requirement has been conventionally accomplished by terminating the output 11 of a line driver amplifier 10 with a line-coupling output resistor 13, whose value Ro is set equal to the impedance Rt (e.g., 135 ohms) of the line 15. Unfortunately, the resulting voltage divider formed by output resistor 13 and line impedance 15 dissipates (wastes) half of the line driver's output power in the output impedance 13. This implies that, for each volt of signal swing to be imparted to the line 15, a two volt swing is required at the output 11 of the amplifier 10.

This unwanted power dissipation or loss can be reduced by synthesizing the output impedance of the driver through the use of a much smaller resistor, and simulating the same line-matching impedance by the judicious use of positive feedback. A typical set of synthetic impedance parameters involves reducing the value of the output resistor to only a fraction (e.g, one-fourth) of its normal value, and (electronically) synthesizing the remaining portion (e.g., three-fourths) of the output impedance. In the case of a one-fourth–three-fourths split, the output voltage swing of the driver amplifier is reducible from twice to only five-fourths the desired output voltage. In the ideal case, the amplifier power supply rails can be reduced to five-eighths of the supply differential for a classic driver.

It is not uncommon for circuit implementations of synthetic output impedance drivers to employ some form of relatively complex cross-coupling network or other feedback arrangements. As shown in the circuit diagram of FIG. 2, a synthesized impedance driver may be modelled as containing a voltage source Vm and an output impedance formed of two parts: 1—a synthetic resistance Rsyn, and 2—a physical output resistance Rphy. The voltage swing produced by the amplifier is Va, and the voltage swing across a load resistance RL (relative to a ground reference) is VL.

For the case of reducing the physical resistor to one-fourth of its normal value, then Rphy=25% of RL and Rsyn=75% of RL. Therefore, the driver voltage source Vm must be capable of producing a voltage swing of 2VL. As pointed out above, the voltage Va at the output node of the amplifier need only swing to 5/4 VL.

In some applications, Va must swing to a voltage greater than 5/4 VL. For example, if the value of the load resistor RL is increased substantially, Va would have to swing to almost 2VL. While this may cause clipping, it entails the benefit of reduced output current with increased output voltage swing. The synthetic impedance line driver might also be required to swing to 2VL, just as in the case of the classical line river. In this case, however, the synthetic driver is delivering zero or minimum current, while the classic driver is delivering its maximum output current.

Another significant consideration occurs in echo-canceled systems, where line drivers 'face' each other at opposite ends of a wireline loop. In this case, Va is determined as the superposition of both 'near' end and 'far' end drivers. In some cases, Va may actually have to be larger than Vm, which requires significant attention to overall system design. This problem is typically addressed by reducing the power on relatively short cables.

In accordance with the invention disclosed in the above-referenced Joffe et al Patent, the line driver circuit employs a positive feedback architecture that reduces the required output signal amplitude excursion required for driving the line, enhances linearity, and allows the line to be driven from amplifiers which run with a lower supply voltage, and thus results in lower power dissipation. The use of a dramatically lower valued output resistor allows the amount of power dissipated across the driver's output resistor to be reduced from the one-half value of a classical driver; yet, due to positive feedback, the effective electrical output impedance seen at the line driver's output node is matched to the line impedance. As a non-limiting example, the synthetic driver configuration of the Joffe et al patent is particularly suited for (extended range) ISDN applications.

SUMMARY OF THE INVENTION

The present invention is also directed to the use of positive feedback for implementing a synthesized impedance line driver circuit, and is especially suited for high data rate signaling, such as but not limited to high data rate digital subscriber line (HDSL) applications. The driver architecture of the invention employs a complementary driver pair whose outputs are coupled through relatively low valued output resistors to a line-coupling transformer. In addition, node connections of the output resistors with respective end terminals of the input winding of the line-coupling transformer are cross-coupled to inputs of the complementary drivers. The parameters of this cross-coupled circuit configuration are such as to produce a relatively large (time-N) multiplication of the small valued output resistors, to values that enable the complementary driver circuit to synthesize an output impedance that matches the impedance of the driven line.

In accordance with a first embodiment, the output impedance-syntheisizing line driver includes first and second operational amplifiers that are coupled between complementary input and output ports. Positive feedback is provided by a first summing resistor cross-coupled between the first output port and an input of the second amplifier, and by a second summing resistor cross-coupled between the second output port and an input of the first amplifier. Each amplifier has an output resistor whose value is several orders of magnitude lower than those of the input and feedback resistors, and is selected in accordance with the operational parameters of the line.

As will be described, for a typical telecommunication application, the input, feedback, and cross-coupled summing resistors, which are used to set the gain parameters of the driver, may have resistance values on the order of one or more kilohms, while the output resistors, whose values are multiplied up to values that enable the circuit to realize a synthetic output impedance necessary for matching the impedance of the driven line (e.g., 135 ohms), may have a resistance value on the order of only several ohms, significantly decreasing power dissipation and reducing supply rail requirements.

Pursuant to a second embodiment of the present invention, the complementary pair-based synthetic line driver circuit architecture of the first embodiment described above is augmented to include a cross-coupled auxiliary resistor network used to derive a near-end signal for driving an analog canceler. These resistors allow a near-end signal to be taken from the driver output and effectively cancels out far end signal components present in the analog canceler drive signal. This resistor network includes a first series connected resistor branch coupled between one end of the output resistor for the first operational amplifier and the opposite end of the output resistor at the second output node. It also includes a second series connected resistor branch coupled between one end of the output resistor at the output of the second operational amplifier and the opposite end of the output resistor at the first output node. The resistors are ratioed such that the signal at nodes between the resistors of each branch corresponds to a prescribed fraction of the open circuit voltage swing of the driver amplifiers.

DETAILED DESCRIPTION

Figure 1:
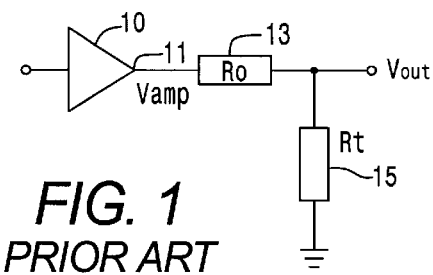
FIG. 1 diagrammatically illustrates a conventional line driver circuit.
Figure 2:
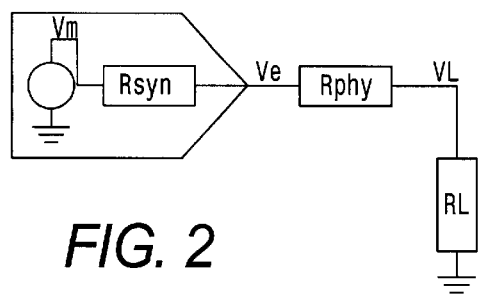
FIG. 2 is a circuit diagram model of a synthesized impedance driver.
Figure 3:
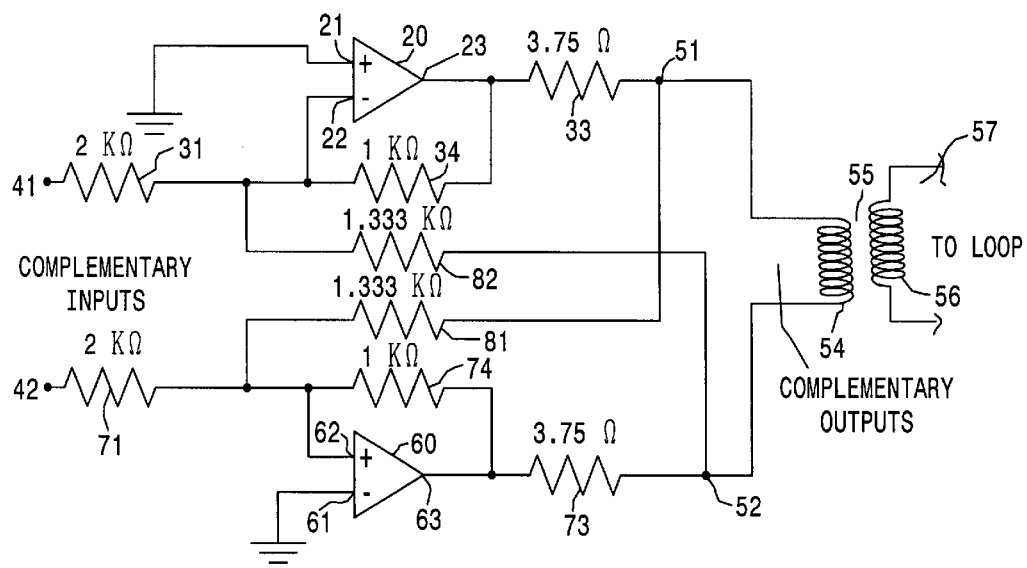
FIG. 3 diagrammatically illustrated a first embodiment of the complementary pair-based synthesized impedance line driver architecture of the invention.

A first embodiment of the improved complementary pair-based, impedance-synthesizing line driver architecture of the present invention is diagrammatically illustrated in FIG. 3 as comprising first and second operational amplifiers 20 and 60, respectively, that are coupled to respective ones of a pair of complementary input ports 41/42, and are operative to amplify an input signal Vin applied thereto for application to a line being driven.

To this end, the first amplifier 20 has first, non-inverting (+) and second, inverting (−) differential polarity input terminals 21 and 22, respectively, and an output terminal 23. The first (+) input terminal 21 of amplifier 20 is coupled to receive a prescribed reference potential (e.g, ground (GND)). An output resistor 33 is coupled between the first amplifier's output terminal 23 and a first output node 51. A feedback resistor 34 is coupled between the first amplifier's output terminal 23 and its second (−) input terminal 22, which is further coupled through an input resistor 31 to the first input port/terminal 41.

The second operational amplifier circuit 60 has first, non-inverting (+) and second, inverting (−) differential polarity input terminals 61 and 62, respectively, and an output terminal 63. The first (+) input terminal 61 is coupled to GND potential, and the second (−) input terminal 62 is coupled through an input resistor 71 to the second input node 42. An output resistor 73 is coupled between output terminal 63 and a second output node 52. A feedback resistor 74 is coupled between the second amplifier's output 63 and the input port 42 of amplifier 60.

The output nodes 51/52 are coupled to opposite ends of an input winding 54 of a line-coupling transformer 55, whose output winding 56 is coupled to the line 57 to be driven. As will be described, for purposes of providing a non-limiting example, the line-coupling transformer 55 may comprise a step-up transformer having an output winding to input winding turns ratio M:1 on the order of 2:1. In order to provide feedback for the two amplifiers a first summing resistor 81 is cross-coupled between the first output terminal 51 and the second (−) input 62 of the second amplifier 60, and a second summing resistor 82 is cross-coupled between the output terminal 52 and the first (−) input 22 of the first amplifier 20.

As pointed out above, and as will be described with reference to a non-limiting example, in the line driver architecture of FIG. 3, the values of output resistors 33 and 73 may be several orders of magnitude lower than those of the input and feedback resistors, and are selected in accordance with the operational parameters of the line being driven. In a typical telecommunication application, the input and feedback resistors, which are used to set the gain parameters of the driver, may have resistance values on the order of one or more kilohms, while the relatively small valued output resistors, which are to be scaled up to synthesized values for matching the impedance of the driven line, may have a resistance value on the order of only several ohms. As pointed out above, this serves to both significantly reduce power dissipation and allows the use of smaller supply rail voltages.

For purposes of providing a non-limiting illustration, it may be reasonably assumed that the line impedance has a nominal value on the order of 135 ohms. As pointed out above, for the case of reducing the physical resistor to one-fourth of its normal value, the value of the actual physical output resistor is 25% or one-fourth of value of the load resistor RL, leaving 75% of RL to be synthesized, and the voltage Va at the output node of the amplifier need only swing to $5⁄4$ of the voltage swing VL across the load resistor RL.

Letting the output swing required on the loop side 57 of the transformer 55 have a value of six volts peak, then with a scaling ratio N=4 (so that 75% of the output impedance is synthesized and 25% is real), a coupling transformer having a turns ratio M=1:1 for a single-ended amplifier would require a voltage swing of $(5⁄4)*6V=7.5$ volts peak, or 15 volts peak-to-peak. Since the circuit architecture of FIG. 3 employs a pair of amplifiers, each half of the circuit needs only produce 7.5 volts peak-to-peak.

In order to accommodate the use of typical 5V power supplies, the 7.5 volt peak-to-peak requirement may be effectively reduced by increasing the transformer turns ratio M. As a non-limiting example, the 7.5 volt requirement may be reduced to 3.75 volts (which falls within the capability of a five volt power supply) by making M equal to 2:1.

At a typical line-coupling transformer impedance of 15 ohms, this leaves 120 ohms of the 135 ohms of the line to be realized. For a transformer turns ratio M=2:1 of the present example, then the required impedance to be synthesized by the driver circuit is therefore $(1/M)^2*(120)=120/4$ or 30 ohms. This means that each half of the complementary driver pair of the circuit of FIG. 3 is responsible for synthesizing half of this impedance or fifteen ohms. For a scaling ratio N=4, the value of each of output resistors 33 and 73 is therefore only $(\frac{1}{4})*(15 \text{ ohms})=3.75$ ohms. Given the values of input resistors 31/71 at 2 kohms, and feedback resistors 34/74 at 1 Kohms, the values required for crosscoupled summing resistors 81/82 to realize the N=4 impedance scaling at amplifier outputs 23 and 73 is 1.333 Kohms. Lower/higher input resistors can be used to raise/lower the gain as needed.

In order to appreciate the improvement provided by the complementary pair-based synthetic line driver circuit architecture of FIG. 3, it is useful to model the parameters of a telecommunication line and a pair of drivers therefor. As diagrammatically illustrated in FIG. 4, such an overall wireline circuit may be modelled a pair of (downstream (central office resident) and upstream (remote premises installed)) single ended drivers denoted as HTU-C and HTU-R, respectively, connected by a two-wire cable therebetween.

The driver HTU-C has an associated series output resistance Rstz and Rreal, coupled in circuit with some length of cable by a transformer, represented by inductor and resistance components of a T-network configuration. The distributed impedance parameters of the transformer include series inductance Ls and resistance Rs components and a T-leg inductance Lm. A parallel capacitance Cprot is coupled across the line at the transformer coupling with the driver HTU-C. Nominal values of the circuit parameters are also shown for the various components.

Taking the case of a cable length of 6 kft, as a non-limiting example, the HTU-R driver may operate at a peak voltage that is reduced to some percentage (80%) of the classical driver. As an illustration, it will be assumed that the HTU-R driver is to deliver 14.593 volts peak, in contrast to a higher voltage requirement of a classic driver of delivering 18.24 volts peak to the line. In a similar fashion, the HTU-C driver is to operate at some percentage (87.1%) of the classical driver. Here, it will be assumed that the HTU-C driver is to deliver 15.27 volts peak, in contrast to a higher voltage requirement of a classic driver of 18.68 volts peak delivered to the load.

Figure 4:
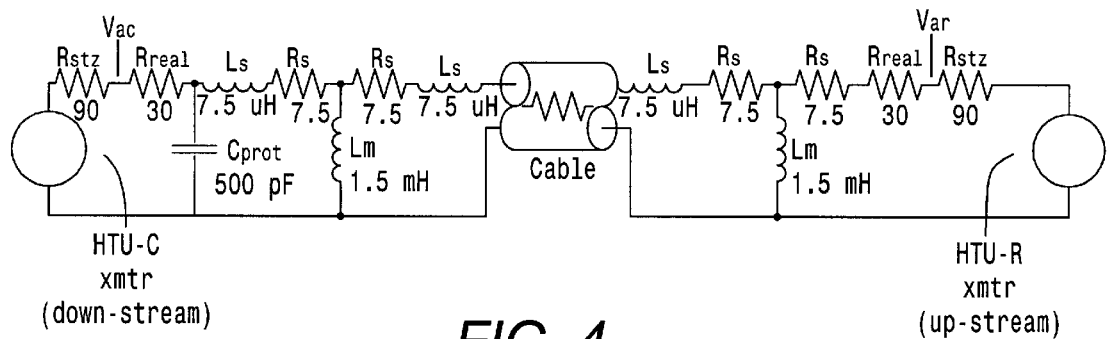
FIG. 4 is a schematic model of parameters of a telecommunication line and drivers therefor.

For the case of a classical driver delivering 18.24 volts peak to the line (load), 13.8 volts appears at node Vac for the near end driver HTU-C, which, for the parameters shown in FIG. 4, delivers a current of $(18.24-13.8)/90=49$ mA. The far end driver HTU-R can generate a peak voltage of 0.78 volts at node Va, for a current of $0.78/90=8.67$ mA (positive or negative). In a worst case, where the far end and near end signals have opposite polarities, the two currents will add, so that the classical driver must deliver 49+8.67 mA=57.67 mA with 18.24 volts of output. However, for the synthetic driver configuration of FIG. 3, described above, out-of-phase contributions produce the same current, but reduce the required output voltage from 13.8+0.78=14.58 V to 13.8−0.78=13 volts. As a consequence, for a high current case, the synthetic driver of FIG. 3 requires even less output swing than the lower current case.

As pointed out briefly above, in a classical line driver architecture, the signal employed to drive an analog echo canceler is taken from the output of the driver. In the synthetic output impedance driver of FIG. 3, this signal will contain a prescribed fraction (three-fourths in the illustrated example) of the far end signal picked off at the output coupling transformer. This far end component of the analog echo canceler drive signal must be removed; otherwise, only one-fourth of the far end signal will still remain after the analog canceler.

One way to remove this far end component is to take the analog canceler drive signal from the same location where the output drivers are driven, as this signal contains no far end signal component. This approach works reasonably well when the drivers are relatively linear and have low noise. In practical terms, however, this is not always the case.

Figure 5:
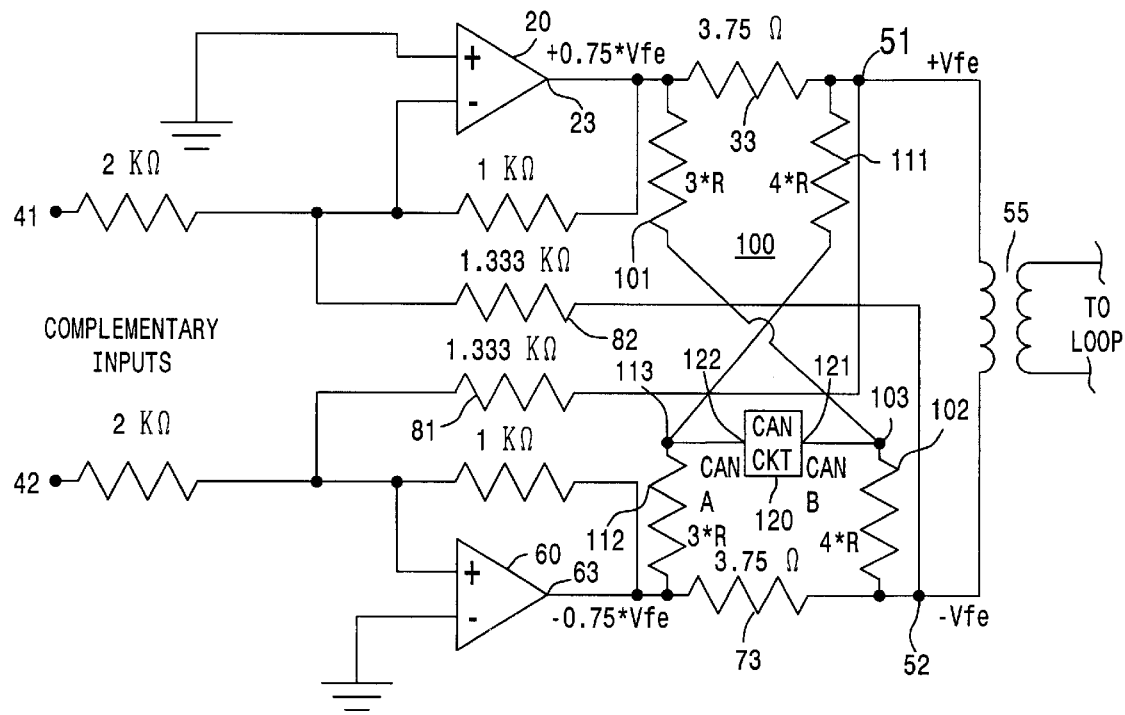
FIG. 5 diagrammatically illustrates a resistor network modification of the line driver circuit of FIG. 3 for canceling out far end signal components to generate a pure near-end signal for use in an analog canceler.

Pursuant to a second aspect of the present invention, diagrammatically illustrated in FIG. 5, the complementary pair-based synthetic line driver circuit architecture of FIG. 3 is augmented by means of a cross-coupled auxiliary resistor network 100, that allows the signal to be taken from the driver output and effectively cancels out the far end signal components present in the analog canceler drive signal.

The auxiliary resistor network 100 includes a first pair of series connected resistors 101 and 102 coupled between one end of the output resistor 33 at the output 23 of the first operational amplifier circuit 20, and the opposite end of the output resistor 63 at the second output node 52. It also includes a second pair of series connected resistors 111 and 112 coupled between one end of the output resistor 73 at the output 63 of the second operational amplifier circuit 60, and the opposite end of the output resistor 33 at the first output node 51.

The values of these auxiliary network resistors are ratioed such that the signal at the junctions 103 between resistors 101, 102, and the junctions 113 between resistors 111, 112 corresponds to a prescribed fraction of the open circuit voltage swing of the driver amplifiers 20 and 60, with the far end signal component completely canceled. The junctions or nodes 103, 113 are coupled to respective ports 121, 122 of an associated canceler circuit 120.

In the (non-limiting) example of FIG. 5, each of resistors 101 and 111 is shown as having some value 3R, and each of resistors 102 and 112 is shown as having some value 4R, so that the total series resistance of a respective pair is 7R. The open circuit voltage between nodes 103 and 113 can be shown to be $\frac{1}{7}$ of the open circuit voltage between nodes 23 and 63. A particular advantage of the circuit of FIG. 5 is that the driver noise and distortion is made available for cancellation. An attenuation of $\frac{1}{7}$ is typically not a concern, as the driver swings are much wider than can be safely used in the analog canceler portion of the circuit.

As will be appreciated from the foregoing description, the use of cross-coupled positive feedback in the complementary amplifier pair-based line driver architecture of the present invention produces a relatively large multiplication of the value of a pair of relatively small valued output resistors. This makes the driver especially suited for high data rate signaling, such as HDSL applications, as it significantly reduces power dissipation and allows for the use of smaller supply voltages.

While I have shown and described several embodiments in accordance with the present invention, it is to be understood that the same is not limited thereto but is susceptible to numerous changes and modifications as known to a person skilled in the art. I therefore do not wish to be limited to the details shown and described herein, but intend to cover all such changes and modifications as are obvious to one of ordinary skill in the art.

What is claimed is:

1. A driver amplifier circuit comprising:

a first operational amplifier having first and second differential polarity inputs and an output, said first differential polarity input of said first operational amplifier being coupled to a first reference potential terminal;

a first input resistor coupling said second differential polarity input of said first operational amplifier to a first of complementary input terminals to which an input signal is applied;

a first negative feedback resistor coupled between said output and said second input of said first operational amplifier;

a first output resistor coupled between said output of said first operational amplifier and a first output terminal to which a load being driven is coupled;

a second operational amplifier having first and second differential polarity inputs and an output, said first differential polarity input of said second operational amplifier being coupled to said first reference potential terminal;

a second input resistor coupling said second differential polarity input of said second operational amplifier to a second of said complementary input terminals;

a second negative feedback resistor coupled between said output and said second input of said second operational amplifier;

a second output resistor coupled between said output of said second operational amplifier and second output terminal to which said load is coupled;

a first positive feedback resistor cross-coupled between said first output terminal and said second differential polarity input of said second operational amplifier; and a second positive feedback resistor cross-coupled between said second output terminal and said second differential polarity input of said first operational amplifier.

2. A driver amplifier according to claim 1, wherein values of said first and second output resistors are on the order of multiple orders of magnitude smaller than values of said input and feedback resistors.

3. A driver amplifier circuit according to claim 1, further including a resistor network cross-coupled between opposite ends of said first and second output resistors.

4. A driver amplifier circuit according to claim 3, wherein said resistor network includes a first plurality of series connected resistors coupled between one end of said first output resistor and an opposite end of said second output resistor, and a second plurality of series connected resistors coupled between one end of said second output resistor and an opposite end of said first output resistor.

5. A driver amplifier circuit according to claim 4, wherein respective first and second nodes of said first and second pluralities of series connected resistors are adapted to be coupled to an analog signal cancellation circuit.

6. A driver amplifier circuit according to claim 4, wherein values of said series connected resistors are ratioed such that a signal at nodes therebetween is a prescribed fraction of the open circuit voltage swing of said operational amplifiers, with far end signal components canceled.

7. A driver amplifier circuit comprising first and second operational amplifiers having differential polarity inputs respectively coupled to a reference potential and through input resistors to complementary input terminals, respective negative feedback resistors coupled between outputs and inputs of said operational amplifiers, first and second output resistors coupled between said outputs of said operational amplifiers and first and second output terminals, and first and second positive feedback resistors cross-coupling said first and second output terminals with inputs of said operational amplifiers.

8. A driver amplifier according to claim 7, wherein values of said first and second output resistors are on the order of multiple orders of magnitude smaller than values of said input and feedback resistors.

9. A driver amplifier circuit according to claim 7, further including a resistor network cross-coupled between opposite ends of said first and second output resistors.

10. A driver amplifier circuit according to claim 9, where in s aid resistor network includes first series connected resistors coupled between one end of said first output resistor and an opposite end of said second output resistor, and second series connected resistors coupled between one end of said second output resistor and an opposite end of said first output resistor.

11. A driver amplifier circuit according to claim 9, wherein respective first and second nodes of said first and second series connected resistors are adapted to be coupled to an analog signal cancellation circuit.

12. A driver amplifier circuit according to claim 11, wherein values of said series connected resistors are ratioed such that a signal at nodes of branches of said network is a prescribed fraction of the open circuit voltage swing of said operational amplifiers, with far end signal components canceled.

13. A method of driving a telecommunication line comprising the steps of:

(a) providing a complementary line driver circuit that is configured to present to a driven line with an impedance that effectively matches that of said line, said complementary line driver including a first operational amplifier having first and second differential polarity inputs and an output, said first differential polarity input of said first operational amplifier being coupled to a first reference potential terminal, a first input resistor coupling said second differential polarity input of said first operational amplifier to a first of complementary input terminals, a first negative feedback resistor coupled between said output and said second input of said first operational amplifier, a first output resistor coupled between said output of said first operational amplifier and a first output terminal to which a load being driven is coupled, a second operational amplifier having first and second differential polarity inputs and an output, said first differential polarity input of said second operational amplifier being coupled to said first reference potential terminal, a second input resistor coupling said second differential polarity input of said second operational amplifier to a second of said complementary input terminals, a second negative feedback resistor coupled between said output and said second input of said second operational amplifier, a second output resistor coupled between said output of said second operational amplifier and second output terminal to which said load is coupled, a first positive feedback resistor cross-coupled between said first output terminal and said second differential polarity input of said second operational amplifier, and a second positive feedback resistor cross-coupled between said second output terminal and said second differential polarity input of said first operational amplifier;

(b) transformer-coupling said first and second output terminals to said line; and (c) applying an input signal across said complementary input terminals.

14. A method according to claim 13, wherein values of said first and second output resistors are on the order of multiple orders of magnitude smaller than values of said input and feedback resistors.

15. A method according to claim 13, wherein said complementary line driver further includes a resistor network cross-coupled between opposite ends of said first and second output resistors.

16. A method according to claim 14, wherein said resistor network includes a first plurality of series connected resistors coupled between one end of said first output resistor and an opposite end of said second output resistor, and a second plurality of series connected resistors coupled-between one end of said second output resistor and an opposite end of said first output resistor.

17. A method according to claim 16, wherein respective first and second nodes of said first and second pluralities of series connected resistors are coupled to an analog signal cancellation circuit.

18. A method according to claim 15, wherein values of said series connected resistors are ratioed such that a signal at nodes therebetween is a prescribed fraction of the open circuit voltage swing of said operational amplifiers, with far end signal components canceled.

* * * * *